US012660389B2

(12) United States Patent
Wang et al.

(10) Patent No.: US 12,660,389 B2
(45) Date of Patent: Jun. 16, 2026

(54) LIGHT-EMITTING SUBSTRATE AND MANUFACTURING METHOD THEREFOR, BACKLIGHT MODULE AND DISPLAY APPARATUS

(71) Applicants: Hefei BOE Ruisheng Technology Co., Ltd., Hefei (CN); BOE TECHNOLOGY GROUP CO., LTD., Beijing (CN)

(72) Inventors: Chenyang Wang, Beijing (CN); Bing Zhang, Beijing (CN); Liang Gao, Beijing (CN); Xiao Wang, Beijing (CN)

(73) Assignees: Hefei BOE Ruisheng Technology Co., Ltd., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 587 days.

(21) Appl. No.: 18/246,404

(22) PCT Filed: May 11, 2022

(86) PCT No.: PCT/CN2022/092195
§ 371 (c)(1),
(2) Date: Mar. 23, 2023

(87) PCT Pub. No.: WO2023/216133
PCT Pub. Date: Nov. 16, 2023

(65) Prior Publication Data
US 2024/0332469 A1 Oct. 3, 2024

(51) Int. Cl.
*H10H 20/856* (2025.01)
*G02F 1/13357* (2006.01)
(Continued)

(52) U.S. Cl.
CPC .......... *H10H 20/856* (2025.01); *H10W 90/00* (2026.01); *H10H 20/0363* (2025.01)

(58) Field of Classification Search
CPC .. H10H 20/85; H10H 20/856; H10H 20/0363; H01L 25/0753; H01L 25/075; G02F 1/1336
See application file for complete search history.

(56) References Cited

U.S. PATENT DOCUMENTS

2006/0093825 A1    5/2006   Lee et al.
2011/0292316 A1   12/2011   Fujimoto et al.
(Continued)

FOREIGN PATENT DOCUMENTS

CN    101684923  A    3/2010
CN    103131191  A    6/2013
(Continued)

*Primary Examiner* — Antonio B Crite
(74) *Attorney, Agent, or Firm* — Dority & Manning, P.A.

(57)    ABSTRACT

A light-emitting substrate and a manufacturing method therefor, a backlight module and a display apparatus are provided. The light-emitting substrate includes a light-emitting assembly and a reflective layer. The light-emitting assembly includes a substrate and a plurality of light-emitting devices arranged on the substrate in an array. The reflective layer is located on a light exit side of the light-emitting assembly. The reflective layer is provided with a plurality of holes arranged in an array, and the plurality of light-emitting devices are located in the plurality of holes respectively. A distance between a center of a light-emitting device of the plurality of light-emitting devices and a center of a hole where the light-emitting device is located in a preset direction is in a range of 0 mm to 0.1 mm, inclusive; and the preset direction is parallel to a side edge of the substrate.

20 Claims, 8 Drawing Sheets

(51) Int. Cl.

| | |
|---|---|
| *H10H 20/01* | (2025.01) |
| *H10H 20/80* | (2025.01) |
| *H10H 20/85* | (2025.01) |
| *H10W 90/00* | (2026.01) |

(56) References Cited

U.S. PATENT DOCUMENTS

| | | |
|---|---|---|
| 2012/0018759 A1 | 1/2012 | Ohta |
| 2016/0252218 A1 | 9/2016 | Fujikawa et al. |
| 2016/0359146 A1 | 12/2016 | Wu |
| 2019/0094618 A1 | 3/2019 | Kyoukane et al. |
| 2019/0146278 A1 | 5/2019 | Son et al. |
| 2019/0285945 A1 | 9/2019 | Kyoukane et al. |
| 2019/0310516 A1 | 10/2019 | Kyoukane et al. |
| 2020/0159073 A1 | 5/2020 | Kyoukane et al. |
| 2021/0187576 A1 | 6/2021 | Wu et al. |
| 2021/0364857 A1 | 11/2021 | Ogawa |
| 2021/0384377 A1 | 12/2021 | Imahori |
| 2022/0005983 A1* | 1/2022 | Liang .................. G02B 6/0073 |

| | | | |
|---|---|---|---|
| 2023/0343902 A1* | 10/2023 | Wu ...................... H10H 20/841 |
| 2024/0038744 A1* | 2/2024 | Xiang ............... H10H 20/8506 |

FOREIGN PATENT DOCUMENTS

| | | | | |
|---|---|---|---|---|
| CN | 108155272 A | * | 6/2018 | ........... H10H 20/854 |
| CN | 110635017 A | * | 12/2019 | ........... H10H 20/857 |
| CN | 111562701 A | | 8/2020 | |
| CN | 211454174 U | | 9/2020 | |
| CN | 211507676 U | | 9/2020 | |
| CN | 111752041 A | | 10/2020 | |
| CN | 111933631 A | | 11/2020 | |
| CN | 112799253 A | | 5/2021 | |
| CN | 112882282 A | | 6/2021 | |
| CN | 113126363 A | | 7/2021 | |
| CN | 113296309 A | | 8/2021 | |
| CN | 113777826 A | | 12/2021 | |
| CN | 215729192 U | | 2/2022 | |
| EP | 3088947 A1 | | 11/2016 | |
| JP | 2012146426 A | | 8/2012 | |
| KR | 101739095 B1 | * | 5/2017 | ......... H01L 25/0753 |
| KR | 20200098340 A | | 8/2020 | |

* cited by examiner

| | |
|---|---|
| Provide a light-emitting assembly | S1 |
| Provide a reflective layer | S2 |
| Attach the reflective layer to the light-emitting assembly in the preset direction | S3 |
| Pre-bake the light-emitting assembly to which the reflective layer has been attached | S4 |
| Provide protective adhesives in and above the openings of the reflective layer | S5 |
| Cure the protective adhesives | S6 |

LIGHT-EMITTING SUBSTRATE AND MANUFACTURING METHOD THEREFOR, BACKLIGHT MODULE AND DISPLAY APPARATUS

CROSS-REFERENCE TO RELATED APPLICATION

This application is a national phase entry under 35 USC 371 of International Patent Application No. PCT/CN2022/092195 filed on May 11, 2022, which is incorporated herein by reference in its entirety.

TECHNICAL FIELD

The present disclosure relates to the field of display technologies, and in particular, to a light-emitting substrate and a manufacturing method therefor, a backlight module and a display apparatus.

BACKGROUND

With rise and gradual maturity of an organic light-emitting diode (OLED) technology, OLED products are becoming favored in the market. However, the OLED products have disadvantages of high cost and low reliability. In order to simultaneously achieve advantages of the OLED products such as high contrast, light weight and small thickness, and advantages of liquid crystal display (LCD) products such as low cost and high reliability, products with tiny LEDs as backlight sources come into being.

The tiny LEDs include micro light-emitting diodes (Micro LEDs) and mini light-emitting diodes (Mini LEDs). A dimension (for example, length) of the micro LED is less than 100 micrometers such as in a range of 10 micrometers to 50 micrometers. A dimension (for example, length) of the mini LED is 100 micrometers to 500 micrometers such as in a range of 100 micrometers to 120 micrometers.

LCD panels equipped with micro LED backlight have advantages such as high peak brightness, high contrast, low power consumption and high reliability, and have a wide development prospect.

SUMMARY

In an aspect, a light-emitting substrate is provided. The light-emitting substrate includes a light-emitting assembly and a reflective layer.

The light-emitting assembly includes a substrate and a plurality of light-emitting devices arranged on the substrate in an array. The reflective layer is located on a light exit side of the light-emitting assembly, the reflective layer is provided with a plurality of holes arranged in an array, and the plurality of light-emitting devices are located in the plurality of holes. A distance between a center of a light-emitting device of the plurality of light-emitting devices and a center of a hole where the light-emitting device is located in a preset direction is in a range of 0 mm to 0.1 mm, inclusive; and the preset direction is parallel to a side edge of the substrate.

In some embodiments, the reflective layer has a first edge and a second edge that are opposite to each other, and the first edge and the second edge are perpendicular to the preset direction. In a region between the first edge and a center line of the reflective layer parallel to the first edge, the distance between the center of the light-emitting device and the center of the hole where the light-emitting device is located in the preset direction is in a range of 0 mm to 0.05 mm, inclusive.

In some embodiments, in a direction from an end of the hole away from the substrate to an end of the hole proximate to the substrate and in a thickness direction of the substrate, an aperture of the hole decreases.

In some embodiments, an included angle between a sidewall of the hole and the substrate is an obtuse angle.

In some embodiments, the light-emitting substrate further includes a plurality of protective adhesives. At least a portion of a protective adhesive is disposed in the hole, and the protective adhesive covers the light-emitting device located in the hole.

In some embodiments, the protective adhesive fills and covers the hole; and of the plurality of protective adhesives, two adjacent protective adhesives are arranged at intervals.

In some embodiments, a material of the protective adhesive includes an ultraviolet curing adhesive.

In some embodiments, a curing temperature of the protective adhesive is less than a glass-transition temperature of the reflective layer.

In some embodiments, a material of the protective adhesive includes a methyl vinyl silicon oxygen coordination platinum catalyst, and/or a platinum-divinyl tetramethyl disiloxane catalyst.

In some embodiments, a thixotropic index of the protective adhesive is in a range of 4.9 to 5.9, inclusive.

In some embodiments, the light-emitting substrate further includes an adhesive layer. The adhesive layer is disposed on a side of the reflective layer proximate to the light-emitting assembly, the adhesive layer is non-overlapping with the holes, and a side border of the adhesive layer exceeds a side border of the reflective layer to form an excess portion.

In some embodiments, the excess portion of the adhesive layer includes a first sub-region and a second sub-region that are disposed away from a center of the adhesive layer in sequence, and the second sub-region is disposed around the first sub-region.

In some embodiments, a width of the first sub-region is in a range of 0.002 mm to 0.005 mm, inclusive. A width of the second sub-region is $d_4$, and $d_4$ is equal to a product of 0.5, A and $L_3$ ($d_4=0.5 \times A \times L_3$), where A is a shrinkage rate of the reflective layer, and $L_3$ is a length of the reflective layer in the preset direction.

In some embodiments, the light-emitting substrate further includes a white oil layer. The white oil layer is disposed between the substrate and the reflective layer. The white oil layer is provided with a plurality of openings therein, and the plurality of openings expose the light-emitting devices.

In another aspect, a manufacturing method for a light-emitting substrate is provided. The manufacturing method includes: providing a light-emitting assembly, the light-emitting assembly including a substrate and a plurality of light-emitting devices arranged on the substrate in an array, a distance between centers of two light-emitting devices that are farthest away from each other in the light-emitting assembly in a preset direction being a first dimension, and the preset direction being parallel to a side edge of the substrate; providing a reflective layer, the reflective layer being provided with a plurality of holes arranged in an array, a number of the plurality of holes being equal to a number of the plurality of light-emitting devices, a distance between centers of two holes that are farthest away from each other in the reflective layer in the preset direction being a second dimension, and the second dimension being less than the first dimension; and attaching the reflective layer to the light-emitting assembly in the preset direction, so that the plurality of light-emitting devices are located in the plurality of holes, respectively.

In some embodiments, a difference between the first dimension and the second dimension is $\Delta L$, and $\Delta L$ is equal to a product of S and L ($\Delta L = S \times L$), where S is an elongation coefficient of the reflective layer, and L is a value of the second dimension.

In some embodiments, the plurality of light-emitting devices included in the light-emitting assembly are in a plurality of rows, and each row of light-emitting devices includes multiple light-emitting devices that are arranged in sequence in the preset direction. Before the reflective layer is attached, a distance between centers of two adjacent holes in the reflective layer in the preset direction is $L_1$, and $L_1$ is equal to $L_2$ minus a quotient of $\Delta L$ divided by a difference of n minus 1 ($L_1 = L_2 - \Delta L / n - 1$), where $L_2$ is a distance between centers of two adjacent light-emitting devices in a row of light-emitting devices, the two adjacent light-emitting devices correspond to the two adjacent holes respectively, and n is a number of light-emitting devices included in the row of light-emitting devices.

In some embodiments, after attaching the reflective layer to the light-emitting assembly in the preset direction, the manufacturing method further includes: pre-baking the light-emitting assembly to which the reflective layer has been attached; providing protective adhesives in and above the holes; and curing the protective adhesives.

In some embodiments, a pre-baking temperature is in a range of approximately 140° C. to approximately 160° C., inclusive, and pre-baking duration is in a range of approximately 10 min to approximately 30 min, inclusive. A curing temperature is in a range of approximately 140° C. to approximately 160° C., inclusive, and curing duration is in a range of approximately 50 min to approximately 70 min, inclusive.

In some embodiments, after attaching the reflective layer to the light-emitting assembly in the preset direction, the manufacturing method further includes: providing protective adhesives in and above the holes, a curing temperature of the protective adhesives being less than a glass-transition temperature of the reflective layer; and curing the protective adhesives, the curing temperature being in a range of approximately 80° C. to approximately 100° C., inclusive, and curing duration is in a range of approximately 50 min to approximately 70 min, inclusive.

In yet another aspect, a backlight module is provided. The backlight module includes an optical film and the light-emitting substrate according to any one of the above embodiments. The optical film is disposed on a light exit side of the light-emitting substrate.

In yet another aspect, a display apparatus is provided. The display apparatus includes a display panel and the backlight module according to any one of the above embodiments. The backlight module is disposed on a non-light exit side of the display panel.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person having ordinary skill in the art can obtain other drawings according to these accompanying drawings. In addition, the accompanying drawings to be described below may be regarded as schematic diagrams, and are not limitations on an actual size of a product, an actual process of a method and an actual timing of a signal involved in the embodiments of the present disclosure.

DETAILED DESCRIPTION

Figure 1:
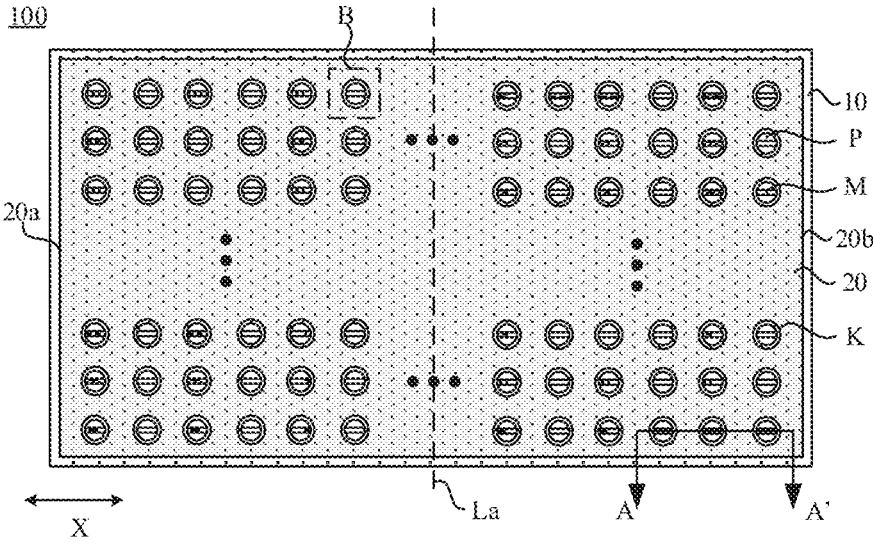
FIG. 1 is a top view of a light-emitting substrate, in accordance with some embodiments.

Technical solutions in some embodiments of the present disclosure will be described clearly and completely with reference to the accompanying drawings below. Obviously, the described embodiments are merely some but not all embodiments of the present disclosure. All other embodiments obtained by a person having ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed in an open and inclusive meaning, i.e., "including, but not limited to". In the description of the specification, the terms such as "one embodiment," "some embodiments," "exemplary embodiments," "example," "specific example" or "some examples" are intended to indicate that specific features, structures, materials or characteristics related to the embodiment(s) or example(s) are included in at least one embodiment or example of the present disclosure. Schematic representations of the above term do not necessarily refer to the same embodiment(s) or example(s). In addition, specific features, structures, materials or characteristics may be included in any one or more embodiments or examples in any suitable manner.

Hereinafter, the terms such as "first" and "second" are used for descriptive purposes only, but are not to be construed as indicating or implying the relative importance or implicitly indicating the number of indicated technical features. Thus, the features defined with "first" and "second" may explicitly or implicitly include one or more of the features. In the description of the embodiments of the present disclosure, the term "a/the plurality of" mean two or more unless otherwise specified.

In the description of some embodiments, the terms such as "electrically connected", "connected" and derivatives thereof may be used. For example, the term "electrically connected" may be used when describing some embodiments to indicate that two or more components are in direct physical contact or electrical contact with each other. The embodiments disclosed herein are not necessarily limited to the content herein.

The phrase "at least one of A, B and C" has the same meaning as the phrase "at least one of A, B or C", both including following combinations of A, B and C: only A, only B, only C, a combination of A and B, a combination of A and C, a combination of B and C, and a combination of A, B and C.

The phrase "A and/or B" includes following three combinations: only A, only B, and a combination of A and B.

The use of the phrase "configured to" herein means an open and inclusive language, which does not exclude apparatuses that are applicable to or configured to perform additional tasks or steps.

The term such as "about", "substantially" or "approximately" as used herein includes a stated value and an average value within an acceptable range of deviation of a particular value determined by a person of ordinary skill in the art, considering measurement in question and errors associated with measurement of a particular quantity (i.e., limitations of a measurement system).

The term such as "parallel", "perpendicular" or "equal" as used herein includes a stated case and a case similar to the stated case within an acceptable range of deviation determined by a person of ordinary skill in the art, considering measurement in question and errors associated with measurement of a particular quantity (i.e., limitations of a measurement system). For example, the term "parallel" includes absolute parallelism and approximate parallelism, and an acceptable range of deviation of the approximate parallelism may be, for example, a deviation within 5°; the term "perpendicular" includes absolute perpendicularity and approximate perpendicularity, and an acceptable range of deviation of the approximate perpendicularity may also be, for example, a deviation within 5°. The term "equal" includes absolute equality and approximate equality, and an acceptable range of deviation of the approximate equality may be, for example, a difference between two equals of less than or equal to 5% of either of the two equals.

It will be understood that, when a layer or element is referred to as being on another layer or substrate, it may be that the layer or element is directly on the another layer or substrate, or that there is an intermediate layer between the layer or element and the another layer or substrate.

Exemplary embodiments are described herein with reference to segmental views and/or plan views as idealized exemplary drawings. In the accompanying drawings, thicknesses of layers and sizes of regions are enlarged for clarity. Thus, variations in shape with respect to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown to have a rectangular shape generally has a feature of being curved. Therefore, the regions shown in the accompanying drawings are schematic in nature, and their shapes are not intended to show actual shapes of regions in an apparatus, and are not intended to limit the scope of the exemplary embodiments.

With development of a display technology, products with tiny light-emitting diodes (LEDs) as backlight sources are gradually favored. In the product with the tiny LEDs as the backlight source, after a die bonding process is completed, for example, after light-emitting devices are welded on a substrate to obtain a light-emitting assembly, a reflective layer is attached to the light-emitting assembly. Moreover, holes formed in the reflective layer are aligned with the light-emitting devices, so that light emitted by the light-emitting devices can effectively exit from the holes.

In a case, after the reflective layer is attached to the light-emitting assembly, light-emitting effect of at least some of the light-emitting devices in the light-emitting assembly may be reduced to a great degree. For example, intensity and brightness of light emitted by the some of the light-emitting devices may be reduced.

The inventors of the present disclosure found that after the reflective layer is attached to the light-emitting assembly, holes in the reflective layer cannot be aligned with light-emitting devices completely, and the reflective layer covers some of the light-emitting devices and shields light emitted by the light-emitting devices. As a result, light-emitting effect of at least some of the light-emitting devices in the light-emitting assembly may be sharply reduced, which may affect display effect of the product with the micro LEDs as the backlight source, and reduce a yield of the product.

In order to solve the above technical problems, embodiments of the present disclosure provide a light-emitting substrate 100.

As shown in FIG. 1, the light-emitting substrate 100 includes a light-emitting assembly 10 and a reflective layer 20. The reflective layer 20 is disposed on a light exit side of the light-emitting assembly 10 (a side of the light-emitting assembly 10 where light is emitted).

Figure 2:
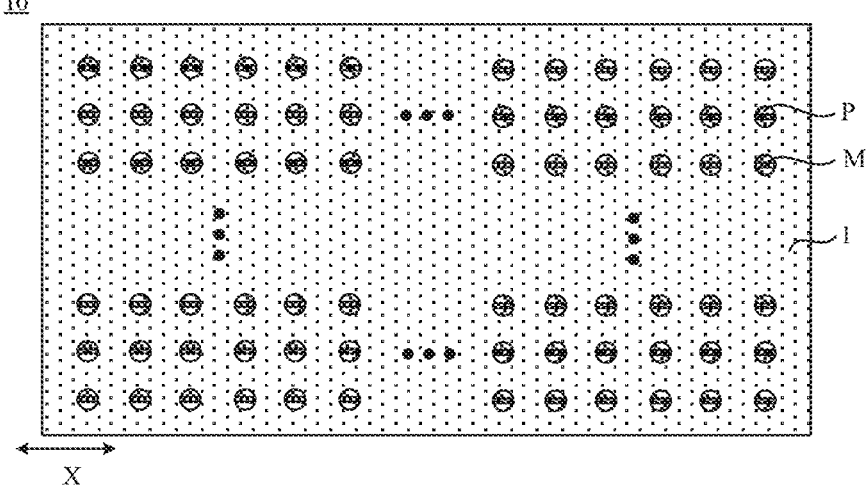
FIG. 2 is a top view of a light-emitting assembly, in accordance with some embodiments.

As shown in FIG. 2, the light-emitting assembly 10 includes a substrate 1 and a plurality of light-emitting devices M disposed on the substrate 1. The plurality of light-emitting devices M are arranged in an array.

The light-emitting devices M may be tiny LEDs, such as mini LEDs, or micro LEDs.

For example, as shown in FIG. 2, the light-emitting assembly 10 includes the substrate 1, and the plurality of light-emitting devices M are disposed on the substrate 1. For example, the light-emitting devices M are welded on the substrate 1.

For example, the plurality of light-emitting devices M are electrically connected to the substrate 1. For example, the plurality of light-emitting devices M are electrically connected to signal lines on the substrate 1.

For example, the substrate 1 may include any one of a glass substrate, a quartz substrate, a sapphire substrate, a ceramic substrate, and the like.

For example, the substrate 1 may be a semiconductor substrate. The semiconductor substrate is any one of a single crystal semiconductor substrate or a polycrystalline semiconductor substrate made of silicon, silicon carbide or the like, a compound semiconductor substrate such as silicon germanium compound, a silicon on insulator (SOI) substrate, and the like.

For example, the substrate 1 may also include an organic resin material such as epoxy, triazine, silicone resin, or polyimide.

For example, the substrate 1 may also be a flame retardant-level 4 (FR-4) type printed circuit board (PCB), or a flexible PCB that is easily deformable.

For example, the substrate 1 may also include any one of a ceramic material such as silicon nitride, AlN or $Al_2O_3$, or metal or metal compound, or a metal core PCB (MCPCB) or a metal copper clad laminate (MCCL).

For example, as shown in FIG. 2, the substrate 1 are provided with bonding pads P thereon, and the bonding pads P are made of a bare conductive material. The light-emitting devices M are fixed on the substrate 1 through the bonding pads P, and are electrically connected to the signal lines on the substrate 1 through the bonding pads P.

For example, the substrate 1 may have a plurality of device mounting regions, and the light-emitting devices M are correspondingly disposed in the device mounting regions. At least one first connection pad and at least one second connection pad may be disposed in each device mounting region. A first connection pad and a second connection pad in a same device mounting region may be electrically connected to electrode pins of a same light-emitting device M. For example, the first connection pad is electrically connected to a negative (N) electrode pin of the light-emitting device M, and the second connection pad is electrically connected to a positive (P) electrode pin of the light-emitting device M.

The substrate 1 may further include a circuit pattern electrically connected to the at least one first connection pad and the at least one second connection pad, so that the plurality of light-emitting devices M are connected to each other in series and/or in parallel.

For example, the substrate 1 may be configured to shield visible light (not to allow the visible light to pass therethrough). When the substrate 1 shields the visible light, ambient light may be prevented from entering the light-emitting devices M formed on the substrate 1 from outside, thereby preventing the ambient light from interfering with normal illumination of the light-emitting devices M. It will be noted that embodiments of the present disclosure are not limited thereto, and the substrate 1 may allowed the visible light to pass therethrough.

Figure 3:
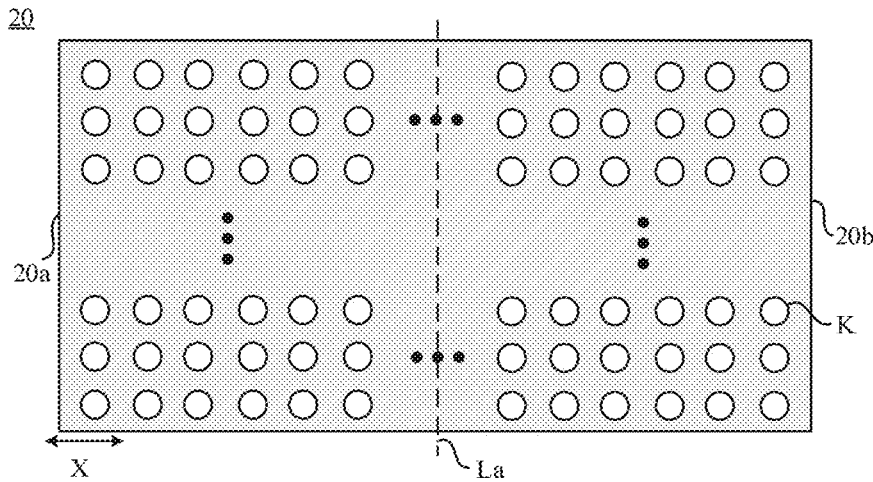
FIG. 3 is a top view of a reflective layer, in accordance with some embodiments.

As shown in FIG. 3, the reflective layer 20 is provided with a plurality of holes K arranged in an array.

As shown in FIG. 1, the plurality of light-emitting devices M are in one-to-one correspondence with the plurality of holes K, and the plurality of light-emitting devices M are located in the plurality of holes K. By arranging the light-emitting devices M in the holes K, it is possible to prevent the reflective layer 20 from shielding the light emitted by the light-emitting devices M, thereby ensuring light-emitting effect of the light-emitting substrate 100.

Figure 4:
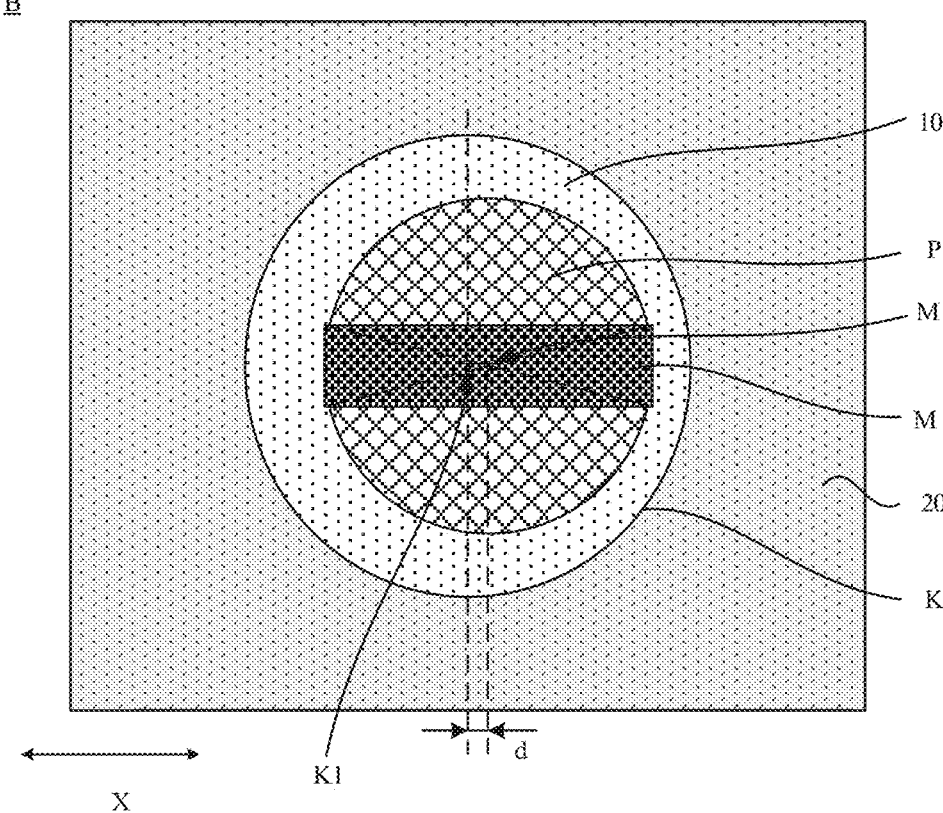
FIG. 4 is an enlarged view of a region corresponding to the dash box B in FIG. 1.

As shown in FIG. 4, a distance d between a center M1 of a light-emitting device M and a center K1 of a hole K where the light-emitting device M is located in a preset direction X is in a range of 0 mm to 0.1 mm, inclusive. For example, the distance d may be 0 mm, 0.001 mm, 0.008 mm, 0.01 mm, 0.035 mm, 0.0785 mm or 0.1 mm.

It will be noted that "the center M1 of the light-emitting device M" described above may be a geometric center of a section of the light-emitting device M parallel to the substrate 1, and "the center K1 of the hole K" described above may be a geometric center of a section of the hole K parallel to the substrate 1.

For example, before the reflective layer 20 is attached to the light-emitting assembly 10, a distance between centers of two holes K that are farthest away from each other in the reflective layer 20 in the preset direction X is less than a distance between centers of two light-emitting devices M that are farthest away from each other in the light-emitting assembly 10 in the preset direction X. That is, before the reflective layer 20 is attached to the light-emitting assembly 10, the reflective layer 20 having a small dimension is provided in advance, so that a difference amount between a dimension of the light-emitting assembly 10 and the initial dimension of the reflective layer 20 may offset an elongation amount of the reflective layer 20 in a subsequent process of attaching the reflective layer 20 to the light-emitting assembly 10. As a result, after the reflective layer 20 is attached to the light-emitting assembly 10, the distance d between the center M1 of the light-emitting device M and the center K1 of the hole K where the light-emitting device M is located in the preset direction X is controlled in the range of 0 mm to 0.1 mm, inclusive. Alignment accuracy of the hole K and the light-emitting device M may be greatly improved.

It will be noted that the distance d between the center M1 of the light-emitting device M and the center K1 of the hole K where the light-emitting device M is located in the preset direction X is an ideal value obtained after process errors such interference factors such as temperature and instrument accuracy are ignored. In an actual product manufacturing process, there may be a slight process deviation, which is not limited in the embodiments of the present disclosure.

The preset direction X is parallel to a side edge of the light-emitting assembly 10. For example, the preset direction X is parallel to a side edge of the substrate 1 of the light-emitting assembly 10.

For example, in a process of manufacturing the light-emitting substrate 100, the preset direction X is an attaching direction where the reflective layer 20 is attached to the light-emitting assembly 10.

The distance d between the center M1 of the light-emitting device M and the center K1 of the hole K where the light-emitting device M is located in the preset direction X is controlled in the range of 0 mm to 0.1 mm, inclusive, so as to improve the alignment accuracy of the hole K of the reflection layer 20 and the light-emitting device M. As a result, the reflection layer 20 may be effectively prevented from covering the light-emitting device M, and the reflection layer 20 may be prevented from shielding a transmission path of the light emitted by the light-emitting device M, which may improve light-emitting efficiency of the light-emitting device M and the light-emitting effect of the light-emitting substrate 100.

In some embodiments, as shown in FIGS. 1 and 3, the reflective layer 20 has a first edge 20a and a second edge 20b that are opposite to each other, and both the first edge 20a and the second edge 20b are perpendicular to the preset direction X.

In a region between the first edge 20a and a center line La of the reflective layer 20 parallel to the first edge 20a, the distance d between the center M1 (referring to FIG. 4) of the light-emitting device M and the center K1 (referring to FIG. 4) of the hole K where the light-emitting device M is located in the preset direction X (referring to FIG. 4) is in a range of 0 mm to 0.05 mm, inclusive. For example, the distance d may be 0 mm, 0.001 mm, 0.008 mm, 0.01 mm, 0.035 mm, 0.0475 mm or 0.05 mm.

In the region between the first edge 20a and the center line La of the reflective layer 20 parallel to the first edge 20a, the distance d between the center M1 of the light-emitting device M and the center K1 of the hole K where the light-emitting device M is located in the preset direction X is controlled in the range of 0 mm to 0.05 mm, inclusive, which may further improve the alignment accuracy of the hole K of the reflective layer 20 and the light-emitting device M. As a result, light-emitting efficiency of light-emitting devices M in the region between the first edge 20a and the center line La of the reflective layer 20 parallel to the first edge 20a may be improved, and the light-emitting effect of the light-emitting substrate 100 may be improved.

Figure 5:
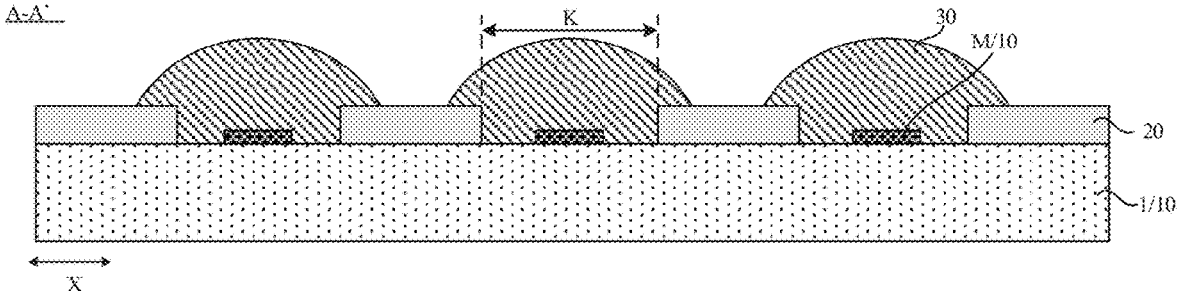
FIG. 5 is a sectional view taken along the line A-A' in FIG. 1.

In some embodiments, as shown in FIG. 5, the light-emitting substrate 100 further includes a plurality of protective adhesives 30. At least a portion of the protective adhesive 30 is disposed in the hole K, and the protective adhesive 30 covers the light-emitting device M located in the hole K.

For example, the protective adhesive 30 may be in a liquid adhesive form, a dispenser sprays the protective adhesive 30 with the liquid adhesive form onto the light-emitting devices M (i.e., dispensing adhesive), and the protective adhesives 30 each are cured to form a hemispherical lens as shown in FIG. 5.

The protective adhesive 30 is configured to encapsulate the light-emitting device M, so as to protect the light-emitting device M from damage of moisture or external force in an external environment. Moreover, the protective adhesive 30 covers the light-emitting device M as the hemispherical lens, which may improve the light-emitting effect of the light-emitting device M.

In exemplary embodiments, the protective adhesive 30 fills and covers the hole K. In this way, the hole K of the reflective layer (e.g., reflective sheet) 20 may be protected, so as to prevent the hole K from being damaged in a subsequent assembling process.

Of the plurality of protective adhesives 30, two adjacent protective adhesives 30 are arranged at intervals.

For example, there is a distance between adjacent protective adhesives 30, which is convenient for the protective adhesives 30 to form a shape of a hemisphere, thereby improving the light-emitting effect of the light-emitting substrate 100.

The inventors of the present disclosure found that, in the case, after protective adhesive covers the light-emitting device and is cured, a large amount of air bubbles are sealed in the protective adhesive, and especially, there are large air bubbles at a position where a sidewall of the hole is in contact with the light-emitting assembly. As a result, illumination of the light-emitting device may be seriously affected, and the light-emitting effect of the light-emitting substrate may be reduced.

In order to solve the above technical problems, in some embodiments, the hole K in the light-emitting substrate 100 provided by the embodiments of the present disclosure has a funnel-shape. For example, referring to FIG. 6, in a direction from an end of the hole K away from the substrate 1 to an end of the hole K proximate to the substrate 1 and in a thickness direction H of the substrate 1, an aperture of the hole K gradually decreases.

The hole K has the funnel-shape, which may increase escape space of air, so that the protective adhesive 30 may be in sufficient contact with a sidewall K3 of the hole K and the light-emitting assembly 10 in the dispensing process. In this way, a problem that there is residual air at a non-contact position due to insufficient contact between the protective adhesive 30 and the sidewall K3 of the hole K, or insufficient contact between the protective adhesive 30 and the light-emitting assembly 10, and that the residual air is sealed to form air bubbles after the protective adhesive 30 is cured may be avoided. As a result, the air bubbles may be prevented from interfering with a light exit path of the light-emitting device M, and the light-emitting effect of the light-emitting substrate 100 may be effectively improved.

Figure 6:
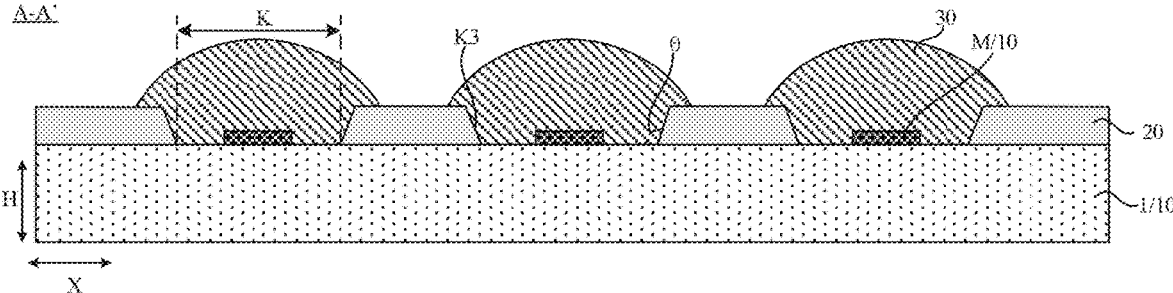
FIG. 6 is another sectional view taken along the line A-A' in FIG. 1.

In exemplary embodiments, as shown in FIG. 6, an included angle θ between the sidewall K3 of the hole K and the substrate 1 is an obtuse angle.

For example, the included angle θ between the sidewall K3 of the hole K and the substrate 1 may be in a range of 120° to 150°, inclusive. For example, the included angle θ between the sidewall K3 of the hole K and the substrate 1 of the light-emitting assembly 10 is in a range of 130° to 140°, inclusive. For example, the included angle θ may be 120°, 125°, 137°, 142.5°, or 150°.

In exemplary embodiments, the sidewall K3 of the hole K may be in a shape of an arc, and the arc protrudes in a direction away from the hole K. The arc sidewall K3 is tangent to the substrate 1, and a central angle corresponding to the arc is an acute angle. The arc sidewall K3 makes the contact position of the sidewall K3 of the hole K and the light-emitting assembly 10 smooth, which is conducive to filling the hole K with the protective adhesive 30. As a result, the problem of the residual air bubbles caused by the insufficient contact between the protective adhesive 30 and both the sidewall K3 of the hole K and the light-emitting assembly 10 may be avoided, and the light-emitting effect of the light-emitting substrate 100 may be further improved.

In some embodiments, a thixotropic index of the protective adhesive 30 is in a range of 4.9 to 5.9, inclusive. By providing the protective adhesive 30 with the low thixotropic index, it is possible to slow down a curing speed of the protective adhesive 30 after dispensing, thereby ensuring that the protective adhesive 30 with the liquid adhesive form sufficiently fills various positions of the hole K. In this way, the air in the hole K is released in time, and the problem that the protective adhesive 30 seals the air bubbles after being cured may be effectively solved. As a result, the air bubbles may be prevented from interfering with the light exit path of the light-emitting device M, and the light-emitting effect of the light-emitting substrate 100 may be effectively improved.

Figure 7:
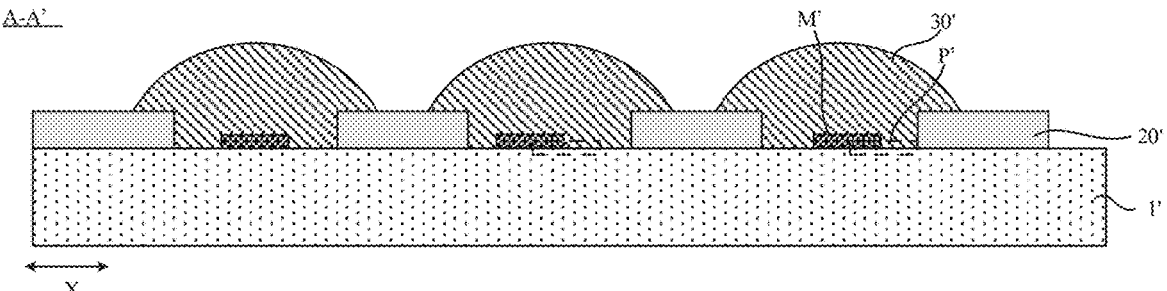
FIG. 7 is a structural diagram of a light-emitting substrate.

In the case, as shown in FIG. 7, after protective adhesives 30' are cured, there are problems that a reflective sheet 20' shrinks and light-emitting devices M' fall off. That is, the light-emitting devices M' are displaced relative to bonding pads P', causing the light-emitting devices M' to fall off from the substrate 1'.

In order to solve the above technical problems, in some embodiments, a material of the protective adhesive 30 in the light-emitting substrate 100 provided by the embodiments of the present disclosure includes an ultraviolet curing adhesive. The protective adhesive 30 may be cured through ultraviolet irradiation after the dispensing.

The material of the protective adhesive 30 is the ultraviolet curing adhesive, so that there is no need to adopt a high temperature baking manner in the process of curing the protective adhesive 30. In this way, the light-emitting substrate 100 may be prevented from being in a high temperature environment, and a situation that the reflective sheet 20 greatly shrinks from a periphery of the reflective sheet 20 to a center of the reflective sheet 20 in the high temperature environment may be avoided. As a result, the problem that the protective adhesive 30 disposed on the reflective sheet 20 is displaced due to the shrinked reflective sheet 20, and that the light-emitting device M covered by the protective adhesive 30 may be caused to be displaced and then to fall off may be avoided. Thus, the yield of the light-emitting substrate 10 may be improved.

In some embodiments, a curing temperature of the protective adhesive 30 is less than a glass-transition temperature of the reflective layer 20.

It will be noted that the "glass-transition temperature" described above is a critical temperature at which the reflective layer 20 transitions from a high elastic state to a glass state, or from the glass state to the high elastic state. Below the glass-transition temperature, the reflective layer 20 has a glass texture and has certain brittleness, and above the glass-transition temperature, the reflective layer 20 has a flexible texture and has high elasticity.

As the temperature increases, during a process of the transition of the reflective layer 20 from the glass state to the high elastic state, activity of molecular chains of the reflective layer 20 at a high temperature increases, and internal stress of the reflective layer 20 causes the reflective layer 20 to shrink from a periphery thereof to a center thereof.

The curing temperature of the protective adhesive 30 is less than the glass-transition temperature of the reflective layer 20, which may avoid the transition of the reflective layer 20 from the glass state to the high elastic state to a certain extent, and may reduce a shrinkage degree of the reflective layer 20. As a result, an amount of displacement of the protective adhesive 30 may be reduced, and the problem that the light-emitting device M is displaced and fall off due to the displacement of the protective adhesive 30 may be avoided. Thus, the yield of the light-emitting substrate 10 may be improved.

For example, a material of the reflective layer 20 may include polyethylene terephthalate, and a glass-transition temperature thereof is in a range of approximately 100° C. to approximately 120° C., inclusive.

For example, the curing temperature of the protective adhesive 30 is in a range of approximately 80° C. to approximately 100° C., inclusive. In this way, an environment temperature of the reflective sheet 20 may be controlled to be less than the glass-transition temperature of the reflective layer 20, the shrinkage degree of the reflective layer 20 may be reduced.

In exemplary embodiments, the material of the protective adhesive 30 includes platinum-based complex catalyst, such as a methyl vinyl silicon oxygen coordination platinum catalyst, and/or a platinum-divinyl tetramethyl disiloxane catalyst.

For example, the material of the protective adhesive 30 may include organic silicon resin. The organic silicon resin is a polysiloxane polymer with a highly cross-linking structure, and a curing mechanism thereof is that, under a heating condition, a three-dimensional net structure is formed in a cross-linking manner through an addition reaction of silicon in a silicon resin material and hydrogen in a cross-linking agent, so as to complete curing.

In a case where a curing condition of the protective adhesive 30' is a curing temperature of 150° C. and a curing time of 1 hour (150° C./1 h), the reflective layer 20' will shrink to a large extent, which may easily cause the light-emitting devices M' to fall off. However, in a case where the curing temperature of the protective adhesive 30' is lowered to below the glass-transition temperature of the reflective layer 20', the curing time is longer. For example, a curing time of 6 h is required at a temperature of 100° C., which seriously affects manufacturing efficiency of the product.

The platinum-based complex catalyst such as the methyl vinyl silicon oxygen coordination platinum catalyst, and/or the platinum-divinyl tetramethyl disiloxane catalyst, are added in the protective adhesive 30, thereby accelerating the addition reaction of silicon and hydrogen. In this way, the curing time of the protective adhesive 30 may be reduced, and the manufacturing efficiency may be ensured. Moreover, the curing temperature of the protective adhesive 30 is maintained below the glass-transition temperature of the reflective layer 20, thereby avoiding the problem that the light-emitting devices M fall off due to the shrinkage of the reflective layer 20, and improving the yield of the light-emitting substrate 100.

Figure 8:
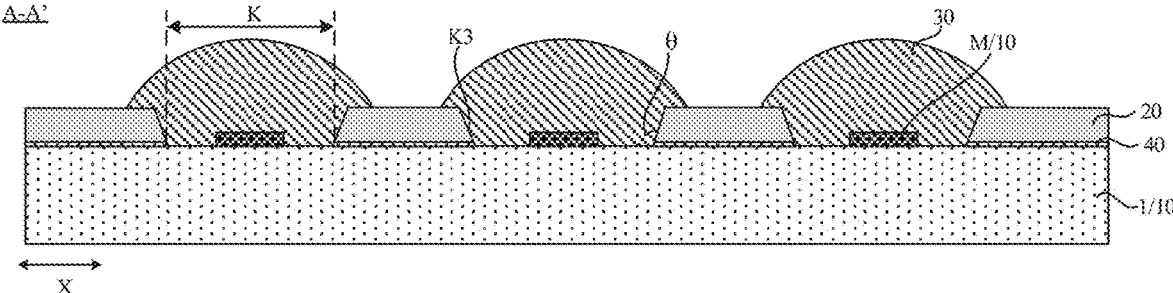
FIG. 8 is yet another sectional view taken along the line A-A' in FIG. 1.

In some embodiments, as shown in FIG. 8, the light-emitting substrate 100 further includes an adhesive layer 40.

As shown in FIG. 8, the adhesive layer 40 is disposed on a side of the reflective layer 20 proximate to the light-emitting assembly 10, and the adhesive layer 40 is non-overlapping with the holes K.

Figure 9:
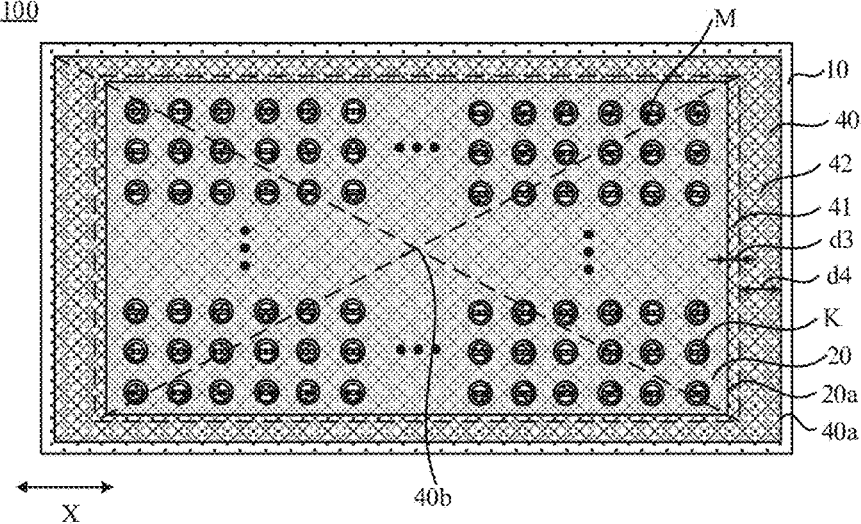
FIG. 9 is another top view of a light-emitting substrate, in accordance with some embodiments.

As shown in FIG. 9, a side border 40a of the adhesive layer 40 exceeds a side border 20a of the reflective layer 20.

The adhesive layer 40 is configured to adhere the reflective layer 20 to the light-emitting assembly 10, for example, the substrate 1 of the light-emitting assembly 10.

In some embodiments, as shown in FIG. 9, an excess portion of the adhesive layer 40 includes a first sub-region 41 and a second sub-region 42 that are disposed away from a center 40b of the adhesive layer in sequence, and the second sub-region 42 is disposed around the first sub-region 41.

In some embodiments, as shown in FIG. 9, a width d3 of the first sub-region 41 is in a range of 0.002 mm to 0.005 mm, inclusive. For example, the width d3 of the first sub-region 41 may be 0.002 mm, 0.0025 mm, 0.00348 mm, 0.004 mm or 0.005 mm.

A width of the second sub-region 42 is $d_4$, and $d_4$ is equal to a product of 0.5, A and $L_3$ ($d_4 = 0.5 \times A \times L_3$), where A is a shrinkage rate of the reflective layer 20, and $L_3$ is a length of the reflective layer 20 in the preset direction X.

It will be noted that the shrinkage rate A of the reflective layer 20 is a shrinkage rate of the reflective layer 20 in a high temperature environment (for example, at a glass-transition temperature of the reflective layer 20). For example, the shrinkage rate of the reflective layer 20 under a baking condition of 150° C./1 h is in a range of approximately 0.07% to approximately 0.08%, inclusive.

Figure 10:
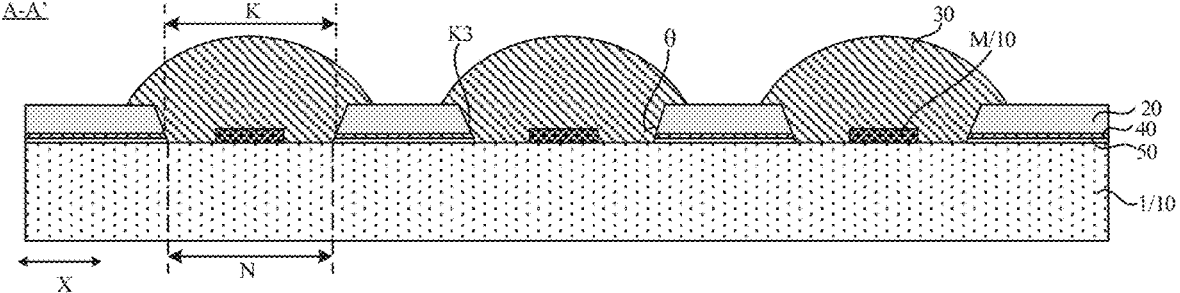
FIG. 10 is yet another sectional view taken along the line A-A' in FIG. 1.

In some embodiments, as shown in FIG. 10, the light-emitting substrate 100 further includes a white oil layer 50.

As shown in FIG. 10, the white oil layer 50 is disposed between the substrate 1 and the reflective layer 20. The white oil layer 50 is provided with a plurality of openings N therein, and the openings N expose the light-emitting devices M, so as to prevent the white oil layer 50 from shielding the light emitted by the light-emitting devices M.

That is, the white oil layer 50 is disposed between the light-emitting assembly 10 and the reflective layer 20, and the white oil layer 50 is non-overlapping with the light-emitting devices M.

For example, as shown in FIG. 10, the white oil layer 50 is disposed between the substrate 1 of the light-emitting assembly 10 and the adhesive layer 40.

For example, the white oil layer 50 may include resin (for example, epoxy resin or polytetrafluoroethylene resin), titanium dioxide ($TiO_2$), and organic solvent (for example, dipropylene glycol methyl ether).

Figure 11:
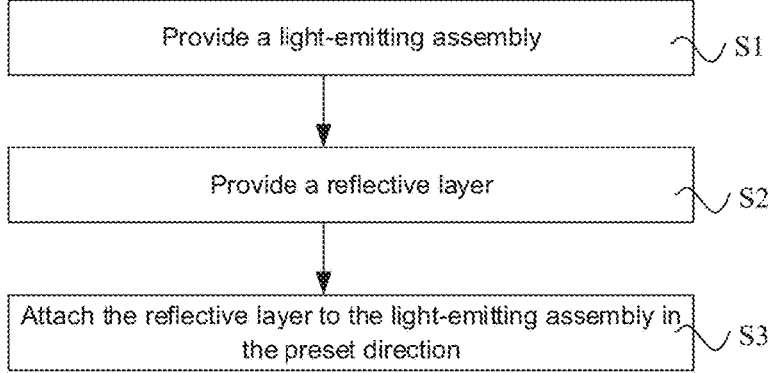
FIG. 11 is a flowchart of a manufacturing method for a light-emitting substrate, in accordance with some embodiments.

Embodiments of the present disclosure provide a manufacturing method for a light-emitting substrate 100. As shown in FIG. 11, the manufacturing method includes the following steps.

In S1, a light-emitting assembly is provided.

Figure 12:
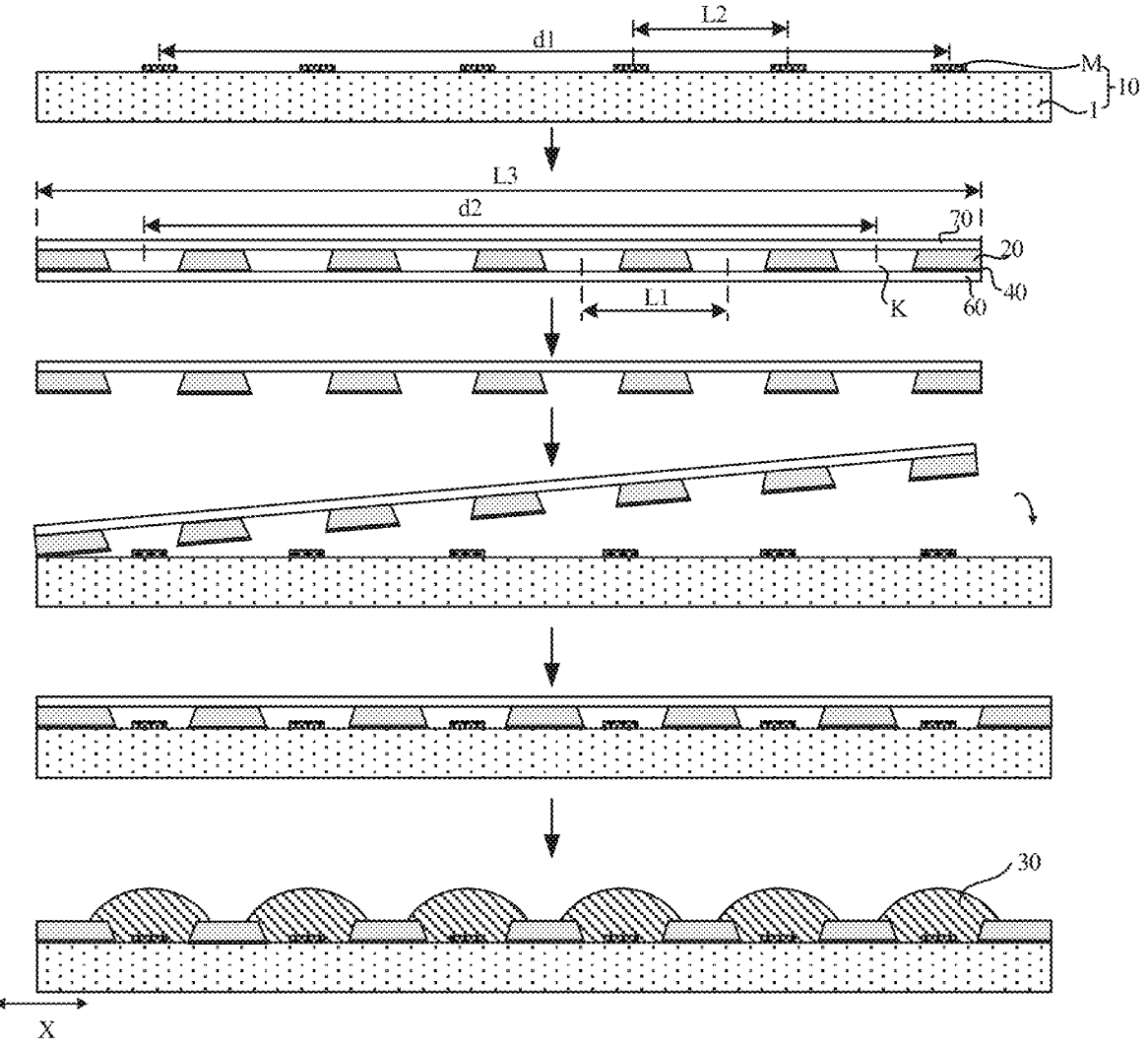
FIG. 12 is a diagram showing processes of a manufacturing method for a light-emitting substrate, in accordance with some embodiments.

As shown in FIG. 12, the light-emitting assembly 10 includes a substrate 1 and a plurality of light-emitting devices M arranged on the substrate 1 in an array.

For example, as shown in FIG. 12, the light-emitting assembly 10 includes the substrate 1, and the light-emitting devices M are welded on the substrate 1.

As shown in FIG. 12, in step S1, a distance between centers of two light-emitting devices M that are farthest away from each other in the light-emitting assembly 10 in a preset direction X is a first dimension d1.

In S2, a reflective layer is provided.

As shown in FIG. 12, the reflective layer 20 is provided with a plurality of holes K arranged in an array, and the number of the plurality of holes K is equal to the number of the plurality of light-emitting devices M.

As shown in FIG. 12, in step S2, a distance between centers of two holes K that are farthest away from each other in the reflective layer 20 in the preset direction X is a second dimension d2.

As shown in FIG. 12, the second dimension d2 is less than the first dimension d1.

For example, as shown in FIG. 12, an adhesive layer 40 is disposed on a side of the reflective layer (e.g., reflective sheet) 20, and the adhesive layer 40 is configured to fix the reflective sheet 20 to the light-emitting assembly 10.

In S3, the reflective layer is attached to the light-emitting assembly in the preset direction.

As shown in FIG. 12, the plurality of light-emitting devices M are located in the plurality of holes K, respectively.

For example, the preset direction X is a direction of attaching the reflective layer 20, and the preset direction X may be parallel to a side edge of the light-emitting assembly 10.

For example, as shown in FIG. 12, after the step S3, the distance between the centers of the two light-emitting devices M that are farthest away from each other in the light-emitting assembly 10 in the preset direction X is substantially equal to the distance between the centers of the two holes K that are farthest away from each other in the reflective layer 20 in the preset direction X.

The second dimension d2 is less than the first dimension d1. That is, before the reflective layer 20 is attached to the light-emitting assembly 10, the reflective layer 20 having a dimension in the preset direction X is provided in advance, so that a difference amount between a dimension of the light-emitting assembly 10 and the initial dimension of the reflective layer 20 may offset an elongation amount of the reflective layer 20 in a subsequent process of attaching the reflective layer 20 to the light-emitting assembly 10. In this way, a problem that the reflective layer 20 covers light-emitting devices M after being elongated in the attaching process, and shields a transmission path of light emitted by the light-emitting devices M may be avoided. As a result, light-emitting efficiency of the light-emitting devices M may be improved, and light-emitting effect of the light-emitting substrate 100 may be improved.

For example, in the light-emitting substrate 100 obtained by the manufacturing method provided by the embodiments of the present disclosure, a distance d between a center M1 of the light-emitting device M and a center K1 of a hole K where the light-emitting device M is located in the preset direction X is controlled in a range of 0 mm to 0.1 mm, inclusive. In this way, alignment accuracy of the hole K of the reflective layer 20 and the light-emitting device M may be greatly improved.

For example, as shown in FIG. 12, the light-emitting substrate 100 further includes a release film 60 and a protective film 70. The release film 60 and the protective film 70 are disposed on both sides of the reflective layer 20 that is not attached, respectively. The release film 60 and the protective film 70 are configured to protect the reflective layer 20 from external damage in a transfer process, and the release film 60 and the protective film 70 are removed in the process of attaching the reflective layer 20.

For example, as shown in FIG. 12, in step S2, the release film 60 and the protective film 70 are disposed on the both sides of the reflective layer 20, respectively. Before step S3, the release film 60 is removed to expose the adhesive layer 40 disposed on the side of the reflective layer 20, which is conducive to attaching the reflective layer 20 to the light-emitting assembly 10. After step S3, the protective film 70 is removed to expose the holes K, which is conducive to dispensing of the protective adhesive 30.

In some embodiments, a difference between the first dimension d1 and the second dimension d2 is $\Delta L$, and $\Delta L$ is equal to a product of S and L ($\Delta L = S \times L$), where S is an elongation coefficient of the reflective layer 20, and L is a value of the second dimension d2.

It will be noted that the reflective layer 20 may be elongated in the attaching process. The "elongation coefficient" described above is an elongation amount per unit length of the reflective layer 20 in the attachment direction (e.g., the preset direction X). For example, in a case where a length of the reflective layer 20 in the attachment direction is 802.2 mm before the reflective layer 20 is attached, and the length of the reflective layer 20 in the attachment direction is 802.5 mm after the reflective layer 20 is attached, the elongation coefficient of the reflective layer 20 is $S = 802.5 - 802.2 / 802.2 = 0.00037$.

For example, the elongation coefficient S of the reflective layer 20 is related to a material of the reflective layer 20, conditions of forming the reflective layer 20 such as temperature and duration. For example, the elongation coefficient S of the reflective layer 20 made of a different material is different.

The manufacturing method described above may be applied to any light-emitting substrate 100 with different sizes and different numbers of light-emitting devices M through a calculation method of the difference $\Delta L$ between the first dimension d1 and the second dimension d2. As a result, after the reflective layer 20 of any light-emitting substrate 100 is attached to the light-emitting assembly 10, high accuracy alignment of the hole K and the light-emitting device M may be achieved, the light-emitting efficiency of the light-emitting device M may be improved, and the light-emitting effect of the light-emitting substrate 100 may be improved.

In some embodiments, referring to FIG. 1, the light-emitting assembly 10 includes a plurality of rows of light-emitting devices M, and each row of light-emitting devices M includes multiple light-emitting devices M are arranged in sequence in the preset direction X.

Before the reflective layer 20 is attached, a distance between centers of two adjacent holes K in the reflective layer 20 in the preset direction X is $L_1$, and $L_1$ is equal to $L_2$ minus a quotient of $\Delta L$ divided by a difference of n minus 1 ($L_1 = L_2 - \Delta L / n - 1$), where $L_2$ is a distance between centers of two adjacent light-emitting devices M in a row of light-emitting devices M, and n is the number of light-emitting devices M included in the row of light-emitting devices M.

Before the reflective layer 20 is attached, the distance between the centers of the two adjacent holes K in the reflective layer 20 in the preset direction X is $L_1=L_2-\Delta L/n-1$, so that the manufacturing method provided by the above embodiments may be applied to light-emitting substrates 100 including different types of reflective layers 20. As a result, the accuracy alignment of the hole K and the light-emitting device M may be improved, and the light-emitting effect of the light-emitting substrate 100 may be improved.

Figure 13:
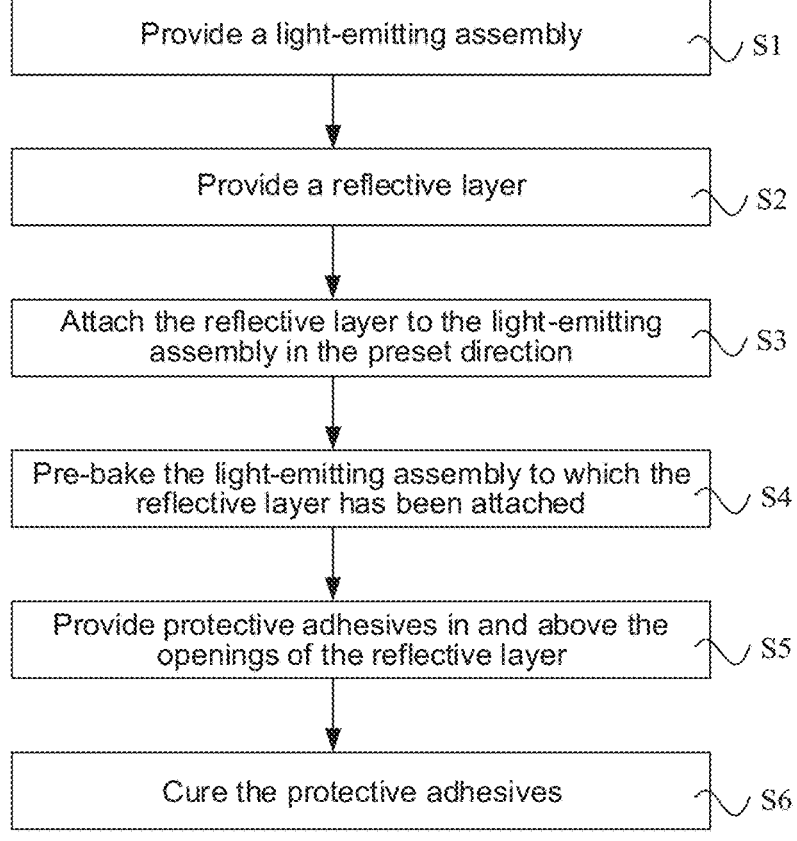
FIG. 13 is another flowchart of a manufacturing method for a light-emitting substrate, in accordance with some embodiments.

In some embodiments, as shown in FIG. 13, after step S3, the above manufacturing method further includes the following steps.

In S4, the light-emitting assembly to which the reflective layer has been attached may be pre-baked.

The reflective layer 20 is pre-baked, so that the reflective layer 20 shrinks before protective adhesives 30 fill the holes K, which may avoid a problem that the protective adhesive 30 is displaced due to the shrinkage of the reflective layer 20 to cause light-emitting devices M to fall off.

For example, a pre-baking temperature is greater than a glass-transition temperature of the reflective layer 20. That is, before the protective adhesives 30 fill the holes K of the reflection layer 20, the reflective layer 20 transitions from a glass state to a high elastic state. In this way, the reflection layer 20 sufficiently shrinks, and a shrinkage degree of the reflection layer 20 after filling with the protective adhesives 30 may be reduced.

For example, the pre-baking temperature is in a range of approximately 140° C. to approximately 160° C., inclusive. For example, the temperature may be 140° C., 143° C., 145.5° C., 150° C., 157.9° C. or 160° C. Pre-baking duration is in a range of approximately 10 min to approximately 30 min, inclusive. For example, the pre-baking duration may be 10 min, 11 min, 15.6 min, 20 min, 28.75 min or 30 min.

In S5, protective adhesives are disposed in and above the holes of the reflective layer.

For example, a material of the protective adhesive 30 may be organic silicon resin in these embodiments.

In S6, the protective adhesives are cured.

For example, the protective adhesives are cured through baking at a high temperature in embodiments.

For example, a curing temperature is in a range of approximately 140° C. to approximately 160° C., inclusive. For example, the curing temperature may be 140° C., 143° C., 145.5° C., 150° C., 157.95° C. or 160° C. The curing duration is in a range of approximately 50 min to approximately 70 min, inclusive. For example, the curing duration may be 50 min, 51 min, 55.6 min, 60 min, 68.75 min or 70 min.

For example, after the reflective layer 20 is pre-baked, a shrinkage amount of the reflective layer 20 may be controlled within 0.005 mm in step S6.

The reflective sheet 20 is pre-baked, so that the reflective layer 20 shrinks before the protective adhesives 30 fill the holes K, and a sufficient transition of the reflective layer 20 from the glass state to the high elastic state may be achieved. In this way, after the protective adhesives 30 fill the holes K, the shrinkage amount of the reflective layer 20 is small in the process of curing the protective adhesives 30, which may avoid a large degree of displacement of the protective adhesive 30. As a result, the problem that the light-emitting devices M fall off due to the displacement of the protective adhesive 30 may be avoided, and the yield of the light-emitting substrate 100 may be improved.

In some embodiments, after step S3, step S4 is omitted, and step S5 and step S6 are directly performed. That is, after step S3, the manufacturing method further includes the following steps.

In S5, protective adhesives are disposed in and above the holes of the reflective layer.

For example, the material of the protective adhesive 30 may include an organic silicon resin and a platinum-based complex catalyst in these embodiments. For example, the material of the protective adhesive 30 includes the organic silicon resin and a methyl vinyl silicon oxygen coordination platinum catalyst, and/or the material of the protective adhesive 30 includes the organic silicon resin and a platinum-divinyl tetramethyl disiloxane catalyst.

In S6, the protective adhesives are cured.

For example, the protective adhesives are cured through baking at a high temperature in embodiments.

For example, the curing temperature of the protective adhesive 30 is less than the glass-transition temperature of the reflective layer 20.

For example, the curing temperature is in a range of approximately 80° C. to approximately 100° C. For example, the curing temperature may be 80° C., 83.358° C., 85.5° C., 90° C., 97.95° C. or 100° C. The curing duration is in a range of approximately 50 min to approximately 70 min. For example, the curing duration may be 50 min, 51 min, 55.6 min, 60 min, 68.75 min or 70 min.

The material of the protective adhesive 30 includes the platinum-based complex catalyst. In this way, there is no need to prolong the curing duration of the protective adhesive 30, and a reduction in production efficiency may be avoided. Moreover, the curing temperature of the protective adhesive 30 is controlled to be below the glass-transition temperature of the reflective layer 20, so that the reflective layer 20 may be prevented from shrinking, the problem that the protective adhesive 30 is displaced due to the shrinkage of the reflective layer 20 to cause light-emitting devices M to fall off may be solved, and the yield of the light-emitting substrate 100 may be improved.

In some embodiments, after step S3, step S4 is omitted, and step S5 and step S6 are directly performed. That is, after step S3, the manufacturing method further includes the following steps.

In S5, protective adhesives are disposed in and above the holes of the reflective layer.

For example, the material of the protective adhesive 30 may include ultraviolet curing adhesive in these embodiments.

In S6, the protective adhesives are cured.

For example, in these embodiments, step S6 includes curing the protective adhesives 30 through an ultraviolet irradiation manner.

The material of the protective adhesive 30 is the ultraviolet curing adhesive, so that there is no need to adopt a high temperature baking manner in the process of curing the protective adhesive 30. In this way, the reflective layer 20 is prevented from being in a high temperature environment, and the reflective layer 20 is prevented from shrinking. As a result, the problem that the protective adhesive 30 is displaced due to the shrinkage of the reflective layer 20 to cause the light-emitting devices M to fall off may be solved, and the yield of the light-emitting substrate 100 may be improved.

Figure 14:
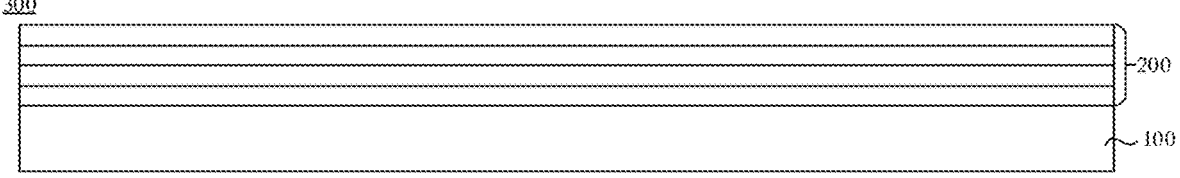
FIG. 14 is a sectional view of a backlight module, in accordance with some embodiments.

As shown in FIG. 14, embodiments of the present disclosure provide a backlight module 300. The backlight module 300 includes an optical film 200 and the light-emitting substrate 100 according to any of the above embodiments.

For example, the light-emitting substrate 100 has a display side and a non-display side. The display side is a side of the light-emitting substrate 100 that can emit light, i.e., a light exit side, and the non-display side is a side of the light-emitting substrate 100 opposite to the display side.

The optical film 200 is disposed on the light exit side of the light-emitting substrate 100.

For example, the optical film 200 may include a plurality of layers. The optical film 200 includes a uniform light sheet and a light enhancement sheet, which may adjust intensity and uniformity of light emitted by the light-emitting devices M, thereby improving display effect of a display apparatus 1000.

Figure 15:
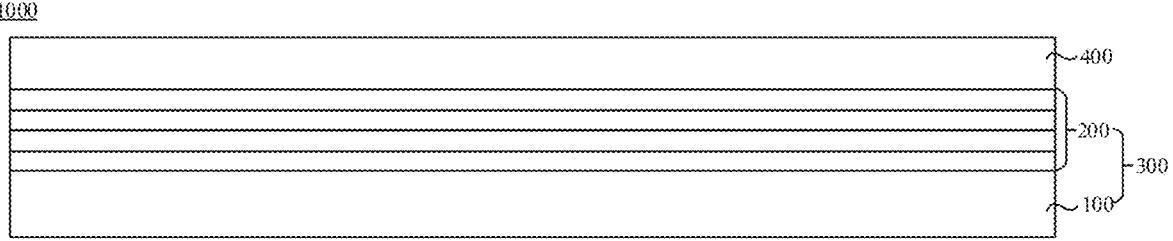
FIG. 15 is a sectional view of a display apparatus, in accordance with some embodiments.
Figure 16:
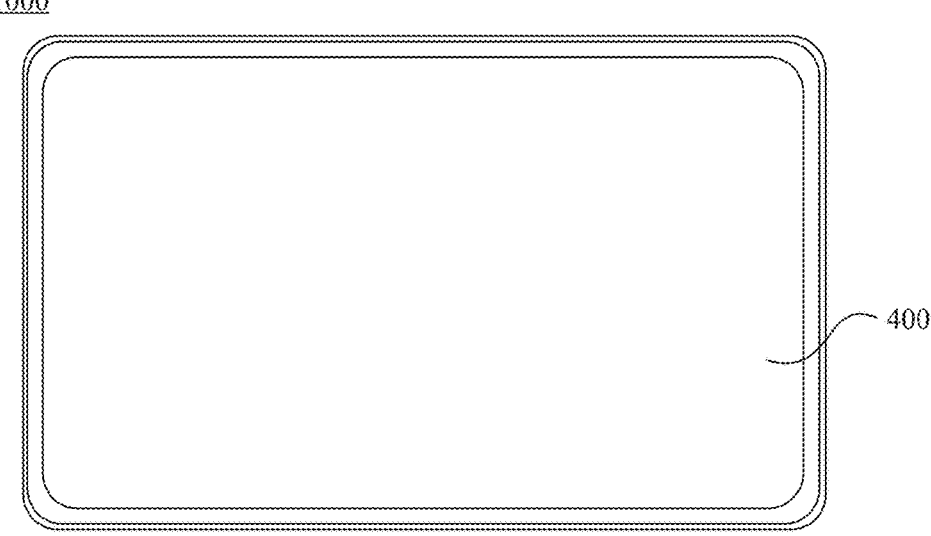
FIG. 16 is a top view of a display apparatus, in accordance with some embodiments.

As shown in FIG. 15 and FIG. 16, embodiments of the present disclosure provides the display apparatus 1000.

The display apparatus 1000 includes a display panel 400 and the backlight module 300 according to any of the above embodiments.

The display panel 400 may be a liquid crystal display panel.

For example, the display panel 400 has a display side and a non-display side. The display side is a side of the display panel 400 that can emit light and achieve image display, and the non-display side is a side of the display panel 400 opposite to the display side, i.e., a non-light exit side.

The backlight module 300 is disposed on the non-display side of the display panel 400.

The backlight module 300 is disposed on the non-display side of the display panel 400, and may provide backlight for the display panel 400 to achieve light-emitting display of the display panel 400.

Beneficial effects that may be achieved by the display apparatus 1000 in the embodiments of the present disclosure are the same as beneficial effects that may be achieved by the backlight module 100, and details are not described herein again.

The display apparatus 1000 may be any device that can display images whether in motion (e.g., videos) or stationary (e.g., still images), and whether textual or graphical. More particularly, it is contemplated that the embodiments may be implemented in or associated with a variety of electronic devices. The variety of electronic devices may include (but are not limit to), for example, mobile telephones, wireless devices, personal digital assistants (PDA), virtual reality (VR) displays, hand-held or portable computers, global positioning system (GPS) receivers/navigators, cameras, MPEG-4 Part 14 (MP4) video players, video cameras, game consoles, watches, clocks, calculators, television (TV) monitors, flat-panel displays, computer monitors, car displays (e.g., odometer displays), navigators, cockpit controllers and/or displays, camera view displays (e.g., display of rear view camera in vehicles), electronic photos, electronic billboards or signs, projectors, architectural structures, packaging and aesthetic structures (e.g., a display for displaying an image of a piece of jewelry).

The above description is only specific embodiments of the present disclosure, but the scope of protection of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A light-emitting substrate, comprising:
a light-emitting assembly including a substrate and a plurality of light-emitting devices arranged on the substrate in an array;
a reflective layer located on a light exit side of the light-emitting assembly, the reflective layer being provided with a plurality of holes arranged in an array, and the plurality of light-emitting devices being located in the plurality of holes; and
a white oil layer disposed between the substrate and the reflective layer, the white oil layer being provided with a plurality of openings therein, and the plurality of openings exposing the light-emitting devices, wherein
a distance between a center of a light-emitting device of the plurality of light-emitting devices and a center of a hole where the light-emitting device is located in a preset direction is in a range of 0 mm to 0.1 mm, inclusive; and the preset direction is parallel to a side edge of the substrate.

2. The light-emitting substrate according to claim 1, wherein the reflective layer has a first edge and a second edge that are opposite to each other, and the first edge and the second edge are perpendicular to the preset direction; and
in a region between the first edge and a center line of the reflective layer parallel to the first edge, the distance between the center of the light-emitting device and the center of the hole where the light-emitting device is located in the preset direction is in a range of 0 mm to 0.05 mm, inclusive.

3. The light-emitting substrate according to claim 1, wherein in a direction from an end of the hole away from the substrate to an end of the hole proximate to the substrate and in a thickness direction of the substrate, an aperture of the hole decreases.

4. The light-emitting substrate according to claim 3, wherein an included angle between a sidewall of the hole and the substrate is an obtuse angle.

5. A backlight module, comprising:
the light-emitting substrate according to claim 1; and
an optical film disposed on a light exit side of the light-emitting substrate.

6. A display apparatus, comprising:
a display panel; and
the backlight module according to claim 5, the backlight module being disposed on a non-light exit side of the display panel.

7. The light-emitting substrate according to claim 1, further comprising:
an adhesive layer disposed on a side of the reflective layer proximate to the light-emitting assembly, the adhesive layer being non-overlapping with the holes, and an outer side border of the adhesive layer exceeding an outer side border of the reflective layer to form an excess portion.

8. The light-emitting substrate according to claim 7, wherein the adhesive layer is disposed between the white oil layer and the reflective layer.

9. The light-emitting substrate according to claim 7, wherein the excess portion of the adhesive layer includes a first sub-region and a second sub-region that are disposed away from a center of the adhesive layer in sequence, and the second sub-region is disposed around the first sub-region.

10. The light-emitting substrate according to claim 9, wherein a width of the first sub-region is in a range of 0.002 mm to 0.005 mm, inclusive; and a width of the second sub-region is $d_4$, and $d_4$ is equal to a product of 0.5, A and $L_3$ ($d_4=0.5 \times A \times L_3$), wherein "A" is a shrinkage rate of the reflective layer, and $L_3$ is a length of the reflective layer in the preset direction.

11. The light-emitting substrate according to claim 1, further comprising:

a plurality of protective adhesives, at least a portion of a protective adhesive being disposed in the hole, and the protective adhesive covering the light-emitting device located in the hole.

12. The light-emitting substrate according to claim 11, wherein the protective adhesive fills and covers the hole; and of the plurality of protective adhesives, two adjacent protective adhesives are arranged at intervals.

13. The light-emitting substrate according to claim 11, wherein a material of the protective adhesive includes an ultraviolet curing adhesive.

14. The light-emitting substrate according to claim 11, wherein a thixotropic index of the protective adhesive is in a range of 4.9 to 5.9, inclusive.

15. The light-emitting substrate according to claim 11, wherein a curing temperature of the protective adhesive is less than a glass-transition temperature of the reflective layer.

16. The light-emitting substrate according to claim 15, wherein a material of the protective adhesive includes a methyl vinyl silicon oxygen coordination platinum catalyst, and/or a platinum-divinyl tetramethyl disiloxane catalyst.

17. A manufacturing method for a light-emitting substrate, the manufacturing method comprising:

providing a light-emitting assembly, the light-emitting assembly including a substrate and a plurality of light-emitting devices arranged on the substrate in an array, a distance between centers of two light-emitting devices that are farthest away from each other in the light-emitting assembly in a preset direction being a first dimension, and the preset direction being parallel to a side edge of the substrate;

providing a reflective layer, the reflective layer being provided with a plurality of holes arranged in an array, a number of the plurality of holes being equal to a number of the plurality of light-emitting devices, a distance between centers of two holes that are farthest away from each other in the reflective layer in the preset direction being a second dimension, and the second dimension being less than the first dimension; and attaching the reflective layer to the light-emitting assembly in the preset direction, so that the plurality of light-emitting devices are located in the plurality of holes, respectively.

18. The manufacturing method according to claim 17, after attaching the reflective layer to the light-emitting assembly in the preset direction, the manufacturing method further comprising:

pre-baking the light-emitting assembly to which the reflective layer has been attached;

providing protective adhesives in and above the holes; and curing the protective adhesives; or after attaching the reflective layer to the light-emitting assembly in the preset direction, the manufacturing method further comprising:

providing protective adhesives in and above the holes, a curing temperature of the protective adhesives being less than a glass-transition temperature of the reflective layer; and curing the protective adhesives.

19. The manufacturing method according to claim 17, wherein a difference between the first dimension and the second dimension is $\Delta L$, and $\Delta L$ is equal to a product of S and L ("$\Delta L$"="$S \times L$"), wherein S is an elongation coefficient of the reflective layer, and L is a value of the second dimension.

20. The manufacturing method according to claim 19, wherein the plurality of light-emitting devices included in the light-emitting assembly are in a plurality of rows, and each row of light-emitting devices includes multiple light-emitting devices that are arranged in sequence in the preset direction; and before the reflective layer is attached, a distance between centers of two adjacent holes in the reflective layer in the preset direction is $L_1$, and $L_1$ is equal to $L_2$ minus a quotient of $\Delta L$ divided by a difference of n minus 1 ($L_1=L_2-\Delta L/n-1$), wherein $L_2$ is a distance between centers of two adjacent light-emitting devices in a row of light-emitting devices, the two adjacent light-emitting devices correspond to the two adjacent holes respectively, and n is a number of light-emitting devices included in the row of light-emitting devices.

\* \* \* \* \*